United States Patent
Clara

(10) Patent No.: US 9,577,657 B1
(45) Date of Patent: Feb. 21, 2017

(54) DELTA SIGMA PATTERNS FOR CALIBRATING A DIGITAL-TO-ANALOG CONVERTER

(71) Applicant: ANALOG DEVICES, INC., Norwood, MA (US)

(72) Inventor: Martin Clara, Newton, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/144,163

(22) Filed: May 2, 2016

(51) Int. Cl.
*H03M 1/10* (2006.01)
*H03M 3/00* (2006.01)
*H03M 1/66* (2006.01)

(52) U.S. Cl.
CPC ....... *H03M 1/1009* (2013.01); *H03M 1/1071* (2013.01); *H03M 1/66* (2013.01); *H03M 3/38* (2013.01)

(58) Field of Classification Search
CPC .... H03M 1/1009; H03M 1/66; H03M 1/1071; H03M 3/38
USPC ......................................... 341/118, 120, 144
See application file for complete search history.

(56) References Cited

U.S. PATENT DOCUMENTS

| | | |
|---|---|---|
| 6,130,632 A | 10/2000 | Opris |
| 6,667,703 B1 * | 12/2003 | Reuveni ............. H03M 1/1028 341/118 |
| 6,919,833 B2 * | 7/2005 | Mills .................. H03M 1/0643 341/118 |
| 7,148,828 B2 | 12/2006 | Fernandez et al. |
| 7,161,412 B1 | 1/2007 | Manganaro |
| 7,394,414 B2 | 7/2008 | Briaire |
| 8,125,361 B2 | 2/2012 | Choe et al. |
| 8,269,480 B2 | 9/2012 | Max et al. |
| 8,378,865 B2 * | 2/2013 | Zhang .................. H03M 1/109 341/118 |
| 2013/0234871 A1 | 9/2013 | Eliezer et al. |

OTHER PUBLICATIONS

Yonghua Cong et al., *A 1.5-V 14-Bit 100-MS/s Self-Calibrated DAC*, 0018-9200/03 © 2003 IEEE Journal of Solid-State Circuits, vol. 38, No. 12, Dec. 2003, 10 pages.

Georgi Ivanov Radulov, *Flexible and Self-Calibrating Current-Steering Digital-to-Analog Converters: Analysis, Classification and Design*, 978-90-386-2125-8, Eindoven University of Technology Library, Jan. 14, 2010, 290 pages.

(Continued)

*Primary Examiner* — Khai M Nguyen
(74) *Attorney, Agent, or Firm* — Patent Capital Group

(57) ABSTRACT

A digital to analog converter (DAC) maps a digital word to an analog output. The DAC bits may have amplitude and timing errors. These errors (or sometimes referred herein as "non-idealities") result in distortion and degradation of the dynamic range in DACs. To reduce these negative effects, delta-sigma patterns can be provided to two bit cells, a reference bit cell and a bit cell under calibration, to perform, e.g., amplitude calibration and timing skew calibration. Delta-sigma patterns are particularly advantageous over square wave signals, which cannot be scaled to perform amplitude calibration between bit cells having different bit weights and are limited in frequency to integer fractions of the sampling clock.

21 Claims, 10 Drawing Sheets

(56) References Cited

OTHER PUBLICATIONS

Qiu Dong et al., *A Current-Steering Self-Calibration 14-bit 100-MSPs DAC*, © 2010 Chinese Institute of Electronics, Journal of Semiconductors, vol. 31, No. 12, Dec. 2010, 5 pages.
Dayn Yang et al., *Built-In Self-Test for Automatic Analog Frequency Response Measurement*, Dept. of Electrical and Computer Engineering, Auburn University, AL, USA, Proc. IEEE International Symp. on Circuits and Systems, pp. 2208-2211, 2005, 4 pages.
Benjamin Jankunas, *Design and Calibration of a 12-Bit Current-Steering DAC Using Data-Interleaving*, a Thesis, Arizona State University, Dec. 2014, 71 pages.
G.I. Radulov et al., *A Self-Calibrating Current-Steering 12-Bit DAC Based on New 1-Bit Self-Test Scheme*, IEEE IC Test Workshop, Limerick, Ireland, Sep. 13-14, 2004, 6 pages.
Tao Zeng, *Static and Dynamic Nonlinearity Compensation Techniques for High Performance Current-Steering Digital-to-Analog Converters*, a Thesis, Iowa State University, Digital Repository @ Iowa State University, 2010, 67 pages.
Maarten De Bock et al., *Calibration of DAC Mismatch Errors in ΣΔ ADCs Based on a Sine-Wave Measurement*, IEEE Transactions on Circuits and Systems—II: Express Briefs, vol. 60, No. 9, Sep. 2013, 5 pages.
Khiem Nguyen et al., *A 108 dB SNR, 1.1 mW Oversampling Audio DAC With a Three-Level DEM Technique*, IEEE Journal of Solid-State Circuits, vol. 43, No. 12, Dec. 2008, 9 pages.
Yongjian Tang et al., *A 14 Bit 200 MS/s DAC with SFDR >78 dBc, IM3 < -83 dBc and NSD < -163 dBm/Hz Across the Whole Nyquist Band Enabled by Dynamic-Mismatch Mapping*, IEEE Journal of Solid-State Circuits, vol. 46, No. 6, Jun. 2011, 11 pages.
Masaaki Nagahara et al., *Frequency Domain Min-Max Optimization of Noise-Shaping Delta-Sigma Modulators*, IEEE Transactions on Signal Processing, vol. 60, No. 6, Jun. 2012, 12 pages.
Hans Van De Vel et al., *A 240mW 16b 3.2GS/s DAC in 65nm CMOS with ,-80dBc IM3 up to 600 MHz*, ISSCC 2014, Session 11, Data Conversion Techniques, 11.7, 2014 IEEE Solid-State Circuits Conference, 3 pages.

\* cited by examiner $u_1(t)$    $2A \cdot \sin(2\pi f_0 t)$ $+$ $u_2(t)$    $-2A \cdot \sin(2\pi f_0 (t + \tau_{SKEW}))$ $\Big\}$ D/A-conversion → sinc

⇓

$\varepsilon(t)$    $-4A \cdot \sin(\pi f_0 \tau_{SKEW}) \cdot \cos(2\pi f_0 (t + 0.5 \cdot \tau_{SKEW}))$    → sinc

FIGURE 8

DELTA SIGMA PATTERNS FOR CALIBRATING A DIGITAL-TO-ANALOG CONVERTER

BACKGROUND

Integrated circuits processes electrical signals for rich electronic applications. Data converters are an important part of electronics, responsible for converting signals between the digital domain and the analog domain. However, circuits inside data converters or circuits driving the data converters are not perfect, and as a result, the conversion output may not be perfect. The imperfections or non-idealities can cause unwanted noise or spurs to appear at the output and degrade the performance of the data converter. If not removed or calibrated out, the noise or spurs can even affect other parts of the signal chain.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 8 illustrates a scheme for extracting timing skew from an output of the DAC, according to some embodiments of the disclosure;

DESCRIPTION OF EXAMPLE EMBODIMENTS OF THE DISCLOSURE

Figure 1:
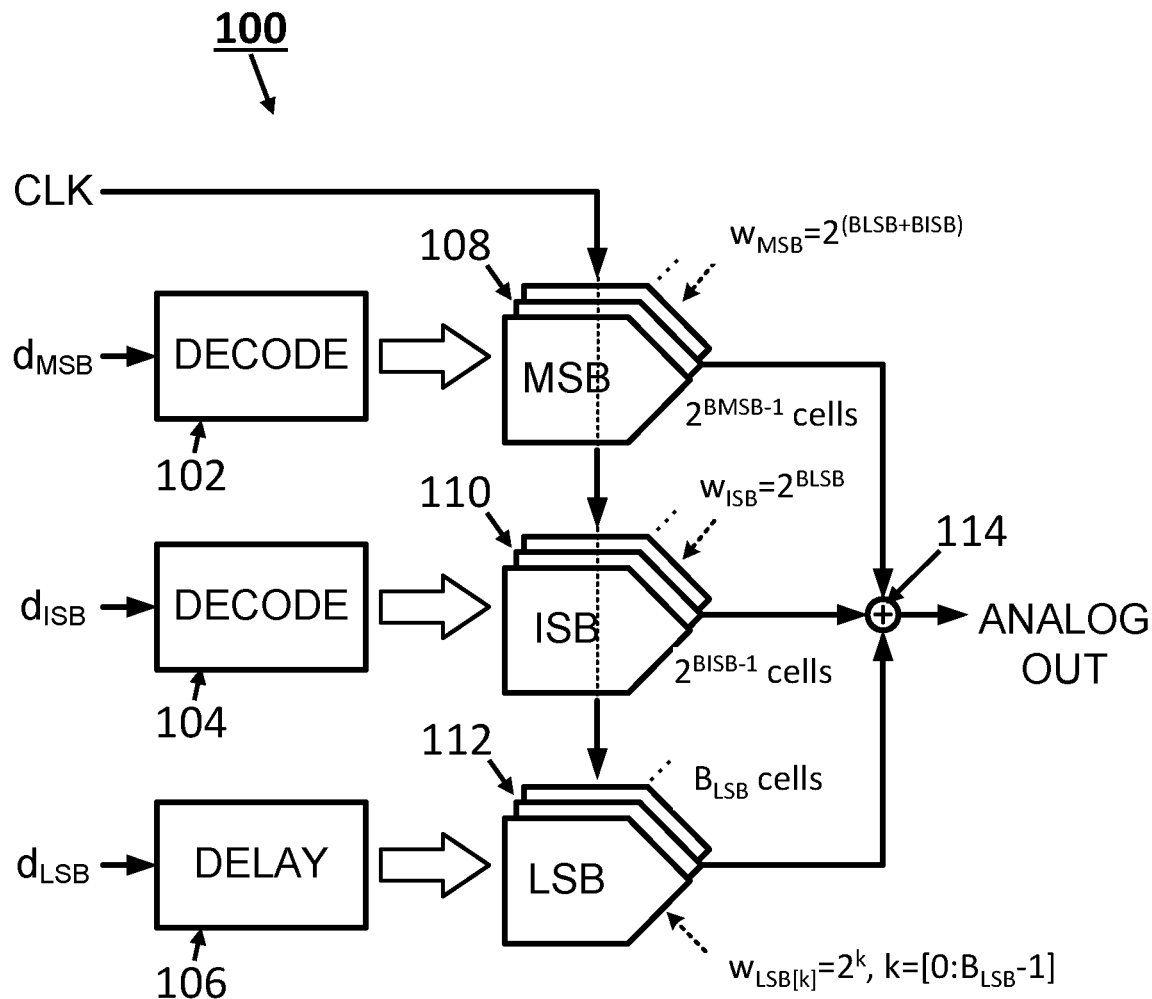
FIG. 1 is an exemplary segmented digital-to-analog converter (DAC), according to some embodiments of the disclosure.

A digital to analog converter (DAC) maps a digital word to an analog output. The DAC bits may have amplitude and timing errors. These errors (or sometimes referred herein as "non-idealities") result in distortion and degradation of the dynamic range in DACs. To reduce these negative effects, delta-sigma patterns can be provided to two bit cells, a reference bit cell and a bit cell under calibration, to perform, e.g., amplitude calibration and timing skew calibration. Delta-sigma patterns are particularly advantageous over square wave signals, which cannot be scaled to perform amplitude calibration between bit cells having different bit weights and are limited in frequency to integer fractions of the sampling clock.

Basics of Digital-to-Analog Converters

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples.

A DAC is a circuit, device, or system that produces a quantized (discrete step) analog output in response to a digital input code. The digital input is generated in the digital domain, e.g., from transistor logic (TTL), emitter-coupled logic (ECL), complementary metal-oxide-semiconductor (CMOS) circuits, or low-voltage differential signaling (LVDS), digital logic, a processor, etc. The DAC converts the digital input into an analog output. The analog output of the DAC may be either a voltage or a current. In some cases, the digital input can include binary coded bits, or thermometer coded bits. Bits of the digital input are provided to drive or control circuits in the DAC to generate the analog output.

To generate the output, a reference quantity is divided into binary and/or linear fractions. One or more DAC cells are implemented for each one of those fractions. The digital input drives switches to individual DAC cells having appropriate weights corresponding to those fractions. Respective parts of the digital input drives respective DAC cells to deliver an aggregate output of the DAC cells that is representative of the digital input. DAC cells can include current sources, voltage sources, resistors, capacitors, etc. The DAC cells can be actuated by the digital input, i.e., digital input code, to generate the analog output. In some embodiments, the outputs of the DAC cells are summed or combined to generate the aggregate output.

In some cases, a segmented DAC can use different circuit architectures and/or coding for different segments of the digital input. Segmented architectures, where the full resolution of the converter is spread across two or more sub-DACs, can be used for both current- and voltage-output DACs. The sub-DACs of the overall DAC need not have the same resolution. In some cases, redundant circuits can also be provided in the DAC where additional circuitry or DAC cells are included in the design.

FIG. 1 illustrates an exemplary segmented DAC 100, according to some embodiments of the disclosure. As shown in FIG. 1, a digital input signal or digital input code can be is provided to a segmentation unit that separates the digital input signal/code into its most significant bits $d_{MSB}$, intermediate significant bits $d_{ISB}$, and least significant bits $d_{LSB}$. Most significant bits $d_{MSB}$ can be provided to decoder block 102. Intermediate significant bits $d_{ISB}$ can be provided to decoder block 104. Decoder block 102 and decoder block 104 can decode the most significant bits $d_{MSB}$ and the intermediate significant bits $d_{ISB}$ from binary coding to thermometer coding, so that unary DAC cells (i.e., DAC cells having the same bit weight) for the MSB segment and the ISB segments can convert the most significant bits $d_{MSB}$ and the intermediate significant bits $d_{ISB}$ into respective analog outputs of the MSB and ISB segments. Least significant bits $d_{LSB}$ can be provided to delay block 106 (to provide or mimic delay of the decoder blocks 102 and 104). Binary weighted DAC cells can convert the least significant bits $d_{LSB}$ into an analog output of the LSB segment. Suppose the full resolution of the segmented DAC 100 is $B=B_{MSB}+B_{ISB}+B_{LSB}$, and there are $B_{MSB}$ number of bits for the most significant bit segment, $B_{ISB}$ number of bits for the intermediate significant bits, $B_{LSB}$ number of bits for the least significant bits. Unary DAC cells 108 for the most significant bits segment can include at least $2^{B_{MSB}-1}$ DAC cells, which all have the same (ideal) bit weight $w_{MSB}=2^{(B_{LSB}+B_{ISB})}$. Unary DAC cells 110 for the intermediate significant bits segment can include at least $2^{B_{ISB}-1}$ DAC cells, which all have the same (ideal) bit weight $w_{ISB}=2^{B_{LSB}}$. Binary DAC cells 112 can have $B_{LSB}$ DAC cells, which have different binary bit weights $w_{LSB[k]}=2^k$, $k=[0:B_{LSB}-1]$. The different segments generate a respective analog output based on the respective digital input to the different segments. A combiner 114 combines, sums, or adds respective outputs of the segments having DAC cells (e.g., segments having unary DAC cells 108, unary DAC cells 110 or binary DAC cells 112) to generate an analog output of the overall DAC 100.

In some cases, the decoder blocks 102 and 104 (either one or both) can implement additional logic to shuffle the unary DAC cells 108 and 110 to average out mismatches between cells to reduce distortion at the analog output.

Segmented DACs such as the one shown in FIG. 1 finds a balance between accuracy and design complexity of a converter. One benefit of segmentation is that of reducing the number of resistors (or current sources) required to achieve a given resolution by allowing different DAC architectures to be used for different segments of the digital input code, thereby allowing smaller die sizes. Thus, it is common for high-resolution DACs to be segmented.

Errors in DACs

Segmented DACs or DACs in general are not perfect, and calibrating the unary or binary DAC cells can pose a challenge to designers. As with many other devices fabricated using complicated manufacturing processes, various imperfections/non-idealities can affect the performance of DACs.

One example includes imperfections of the circuits affecting performance of individual elements of a DAC (referred to herein as a "DAC cell"). The imperfections can be due to manufacturing variations, typically referred to as a "static mismatch" or "DC errors". For instance, static mismatches can be caused by sizes of devices, e.g., resistors, current sources, transistors, being different from ideal sizes. As a result, the "bit weight" of a DAC cell may be off from the ideal value, resulting in an "amplitude error".

Another example includes timing errors, typically referred to as "AC errors", which can be caused by, e.g., clock jitter, switch mismatch, and driver mismatch. Timing errors can be global (e.g., associated with the global clock signal), or they can be local to a particular DAC cell. Timing errors can result in a "wrong" amount of "bit weight" being delivered to the analog output when transitions in the analog output of a DAC cell occurs earlier than or delayed from the ideal time, or the transition deviates from an ideal transition. In some cases, clock jitter can affect when a particular DAC cell is turned on with respect to reference DAC cell (i.e., two DAC cells are not turned on at the same time when it is expected to turn on at the same time). In these scenarios, a DAC cell is turned on and off earlier or later than the ideal time, resulting in an error in the analog output. In some cases, a DAC cell itself can have transition asymmetry, where the rising and falling of the analog output behaves differently. For example, transition asymmetry due to switch mismatch e.g., mismatch in a pair of differential switches responsible for steering a current towards a particular one of the outputs, can affect performance of a particular DAC cell, causing the rising and falling transitions to behave differently. In another example, transition asymmetry due to driver mismatch, e.g., timing mismatch in signal paths driving a pair of differential switches responsible for steering a current towards a particular one of the outputs, can also affect performance of a particular DAC cell, again causing the rising and falling transitions to deviate from the ideal. These timing-related imperfections can also lead to duty cycle error, where the period of a DAC cell being "on" is different from an ideal period (e.g., too long or too short when compared with respect to a reference or ideal period).

Another example include drifts, e.g. thermal drift, aging, etc., which changes the characteristics of the device over time and making the device deviate from the ideal.

Many of these examples mentioned above results in distortions at the analog output, thus affecting the performance of the overall DAC. For some errors, designers have opted to use bigger devices to reduce some of the errors. However, increasing device sizes and thus increasing area and power consumption is not always desirable. Rather than trying to increase devices, designers have dealt with the performance issues through calibration. Various schemes have been proposed to measure and calibrate for errors in the DAC. For instance, square wave of a particular frequency and an inverted version of such square wave can be used to control (1) a reference DAC cell and (2) a DAC cell under test (and more cell(s) if a desired weight is to be achieved to balance the reference DAC cell), and the analog output can be measured to determine timing skew. However, such approach can be limited, and may not be practical for some applications. The downsides of the square wave approach are described in a later section of the disclosure.

Delta-Sigma Patterns for Calibrating DAC Cells

Figure 2:
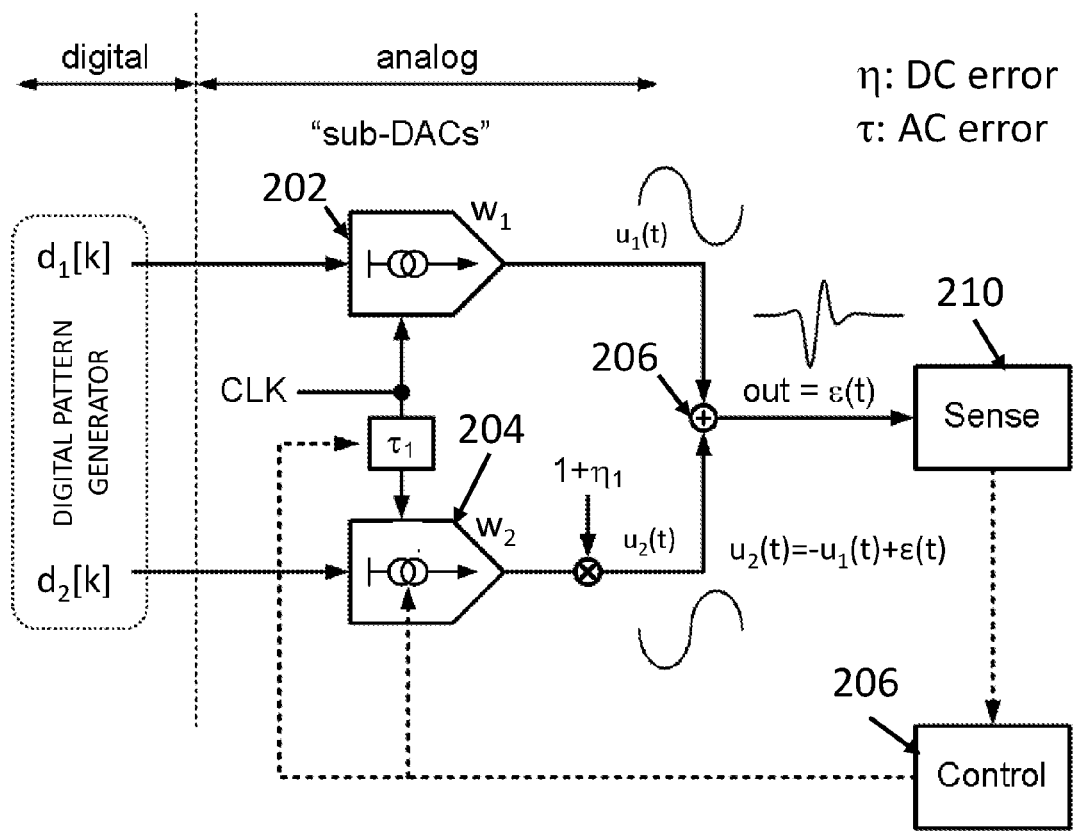
FIG. 2 illustrates modeling, sensing, and correcting errors of a DAC, according to some embodiments of the disclosure.

Instead of using square waves, the present disclosure describes a calibration scheme which involves using coded patterns, e.g., delta-sigma patterns, to drive two different DAC cells (e.g., one reference DAC cell and one DAC cell under test). FIG. 2 illustrates modeling, sensing, and correcting errors of a DAC, according to some embodiments of the disclosure. One objective is to drive the reference DAC cell 202 having weight $w_1$ and the reference DAC cell 204 having weight $w_2$ ($w_1$ and $w_2$ may not equal to each other) to generate output signals $u_1(t)$ and $u_2(t)$ respectively. Herein, DAC cells can be referred to as "bit" or "bit cell", or "DAC bit cell". The model includes $\eta$ representing DC error, and $\tau$ representing AC error. $\eta$ representing DC error, and $\tau$ representing AC error are modeled as being added to the signal path for DAC cell 204 (e.g., as gain error $1+\eta_1$ and timing error $\tau_1$). Since the outputs of the DAC cells 202 and 204 are summed by combiner 206, $u_1(t)$ and $u_2(t)$ are generated to ensure the test signals cancel each other out at the analog output "out" to leave just a residual signal representative of $\eta$ (DC error) and $\tau$ (AC error) at the analog output. For instance, $u_1(t)$ can equal to $u_1(t)$, $u_2(t)$ can equal to $-u_2(t)+\epsilon(t)$.

When $u_1(t)$ and $u_2(t)$ are summed, the analog output "out" is left with $\epsilon(t)$, the residual signal. Generating such signals $u_1(t)$ and $u_2(t)$ requires appropriate test input signals $d_1[k]$ and $d_2[k]$, which can be generated by a suitable digital pattern generator. $d_1[k]$ and $d_2[k]$ are preferably generated to elicit a detectable (in some cases easily detectable) residual signal ϵ(t) that would represent one or more imperfections of DAC.

A sensing circuit 210 can sense the analog output "out" of the overall DAC to sense the residual signal ϵ(t) and extract error information about the DAC cell under test. The sensing circuit 210 can include one or more of the following: one or more filters (e.g., bandpass filters surrounding a predetermined frequency band of interest where the residual signal is expected to have a high amount of energy), an observation analog-to-digital converter (ADC), and an observation receiver. Accordingly, a control circuit 206 can change or control one or more parts of the DAC circuitry to reduce the error corresponding to the error information extracted by the sensing circuit 210. For example, digital circuitry can implement an algorithm to extract the error information from a digital output of an observation ADC/receiver (over a period of time or collecting a sufficient number of samples). The digital circuitry can compute and write one or more coefficients usable by the DAC circuitry to correct or compensate for the error. In some cases, an on-chip processor, a processor coupled to the DAC, and/or digital circuitry for driving the DAC can be used for this purpose. If suitable, a suitable feedback loop can be implemented (using the sensing circuit 210 and the control circuit 206) to sense error information and minimize the error or drive the error to zero. In some circumstances, the processing of the output to determine the error information can also be done off-chip, e.g. in a factory calibration setup during wafer- or chip-level testing, to reduce the amount of on-chip hardware. Such a setup can require permanent on-chip storage (e.g., NVM=Non-Volatile Memory) of the calibration data (e.g., error coefficients usable to reduce the error in the DAC cells).

The coded patterns are particularly suitable for calibrating the DAC cells since a DAC cell cannot be driven by a high resolution (scalable) test signal. Rather, a DAC cell can only be driven by coded patterns, e.g., a two-level bit stream (e.g., a bit stream of 1's and 0's, or a bit stream of −1's and +1's). With proper encoding, a high resolution, digitally-generated, and scalable test signal can be made into, e.g., a two-level bit stream suitable for driving a DAC cell. The coded patterns advantageously allows the extraction of both static and dynamic errors of DAC cells within a DAC. For example, one DAC cell can be chosen as the reference DAC cell, to which all other DAC cells are compared against. With proper coded patterns to the DAC cells, the test signals can be cancelled out at the analog output of the DAC if one coded pattern is a properly weighted and inverted version of the other coded pattern. A residual signal ϵ(t) can be observed at the analog output of the DAC (generated by summing the outputs of the DAC cells). The residual signal ϵ(t) would represent one or more errors between the reference DAC cell and the DAC cell under test.

One advantage of using coded patterns (e.g., delta-sigma encoded bit streams) is that the calibration scheme can be used to calibrate across segments of a segmented DAC since the original test signal from which the test input signals to the DAC cells are generated can be digitally scaled to accommodate for bit weight differences between a reference DAC cell and a DAC cell under test. Conventionally additional DAC cells may be included in the DAC circuitry so that DAC cells can be grouped to achieve a particular bit weight to cancel out the test signal driving the reference DAC cell having that particular bit weight. This method only calibrates the sum of the grouped cells from the lower weight segment and does not correct the individual mismatch of the cells within the group. In standard binary coding, the sum of all active cells in the lower weight segment is one cell short of the weight of the smallest cell in the next higher segment. The missing cell in the lower segment has a weight equal to the smallest weight in that segment, thus grouping to match the weight of a cell in the next higher segment requires at least an extra cell, which is only used during calibration. Using coded patterns, the comparison between two parts of the DAC circuit can be done without requiring additional DAC cells since the test signals can be scaled to have an arbitrary weight to accommodate for bit weight differences between the reference DAC cell and the DAC cell under test.

Example

Delta-Sigma Coded Sinusoids for Driving the DAC Cells

Figure 3:
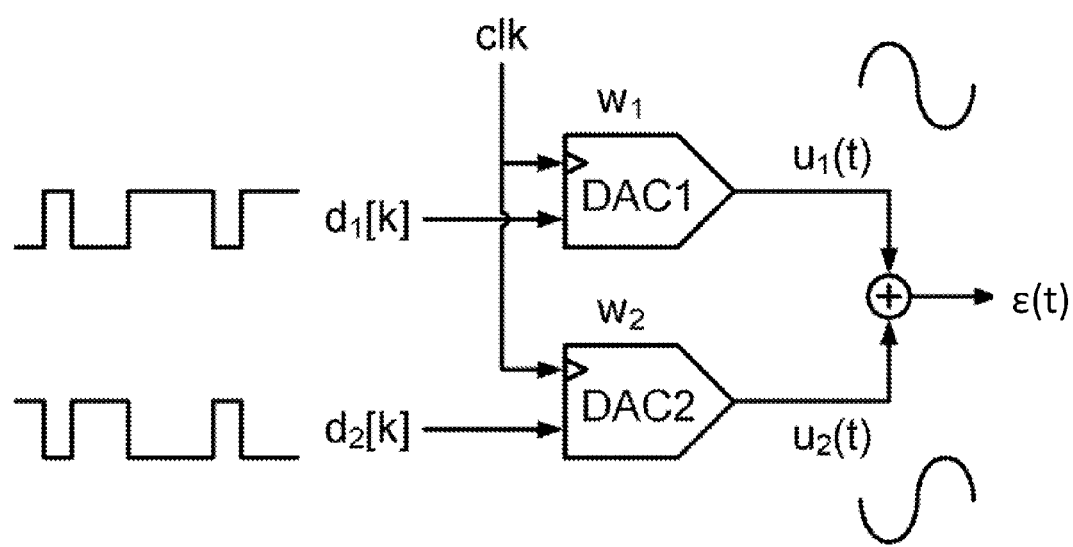
FIG. 3 illustrates providing test input signals to two digital-to-analog converter cells to measure an error of one DAC cell with respect to another DAC cell.

FIG. 3 illustrates providing test input signals to two digital-to-analog converter cells to measure an error of one DAC cell with respect to another DAC cell. In this example, two DAC cells are shown as DAC1 and DAC2 with bit weights $w_1$ and $w_2$ respectively receiving test input signals $d_1[k]$ and $d_2[k]$ respectively. Each of the test input signals $d_1[k]$ and $d_2[k]$ represents a two-level bit stream, for example two, in general different, single-bit delta-sigma patterns. The delta-sigma patterns can encode, for example, a sinusoidal signal. The delta-sigma patterns can also encode other suitable signals having a predetermined or chosen complexity. The suitable signal can be chosen to be within a particular usable bandwidth or to have a particular bandwidth. A suitable signal being encoded in the delta-sigma pattern can be predetermined or chosen to conveniently allow the extraction of the relevant error information after subtraction. For instance, the encoded (digitally intended) signal content in the two cells can be exactly identical in amplitude, but inverse in polarity, such that, after subtraction, only the error information remains. For the instantaneous cell output, after infinite settling time (or after a sufficiently long time), the following relations hold: when $d_1[k]=0$, $u_1(t\to\infty)=0$. When $d_1[k]=1$, $u_1(t\to\infty)=w1/FullScale$. When $d_2[k]=0$, $u_2(t\to\infty)=0$. When $d_2[k]=1$, $u_2(t\to\infty)=(w2+\Delta)/FullScale$. (this can also be formulated as $-0.5*w/FullScale$ and $+0.5*w/FullScale$ for a bit=0 and a bit=1, respectively, as is customary in a fully differential description). FullScale is the full scale of the overall DAC, and Δ represents an error of DAC2 (i.e., DAC cell under test) with respect to DAC1. The encoded (baseband) signal (or the error after subtraction) can be retrieved after appropriate analog filtering (and eventual frequency translation).

If the bit weights $w_1$ and $w_2$ are the same, a delta-sigma pattern encoding, e.g., a sinusoidal signal can be passed through the reference bit cell (e.g., DAC1), and the same delta-sigma pattern of opposite polarity (e.g., inverted version of the sinusoidal signal) can be passed through a second bit cell that under test (e.g., DAC2).

If the bit weights bit weights $w_1$ and $w_2$ are not the same, a first delta-sigma pattern encoding, e.g., a sinusoidal signal can be passed through the reference bit cell (e.g., DAC1), and a second delta-sigma pattern encoding, e.g., a properly weighted and inverted sinusoidal signal can be passed through a second bit cell that under test (e.g., DAC2).

Ideally, one output of the DAC cell is the exact opposite of the output of the other DAC cell (given the appropriate test input signals $d_1[k]$ and $d_2[k]$), i.e., $u_1(t)=-u_2(t)$. But with DAC imperfections (e.g., mismatches and timing skew), $u_1(t)\neq-u_2(t)$ and the sum of the outputs of the two bit cells $u_1(t)$ and $-u_2(t)$ (inversion is done digitally by generating the appropriate test input signals) would result in a residual signal $\epsilon(t)$ at one or more predetermined frequency locations. The analog output of the DAC can be observed to sense the residual signal $\epsilon(t)$, in the foreground or in the background.

In some embodiments, a low frequency sinusoidal signal encoded as a delta-sigma bit stream can be used to calibrate static timing mismatch or DC amplitude errors. In some embodiments, a high frequency sinusoidal signal encoded as a delta-sigma bit stream can be used to accentuate timing errors.

System for Measuring Non-Idealities of a DAC

Figure 4:
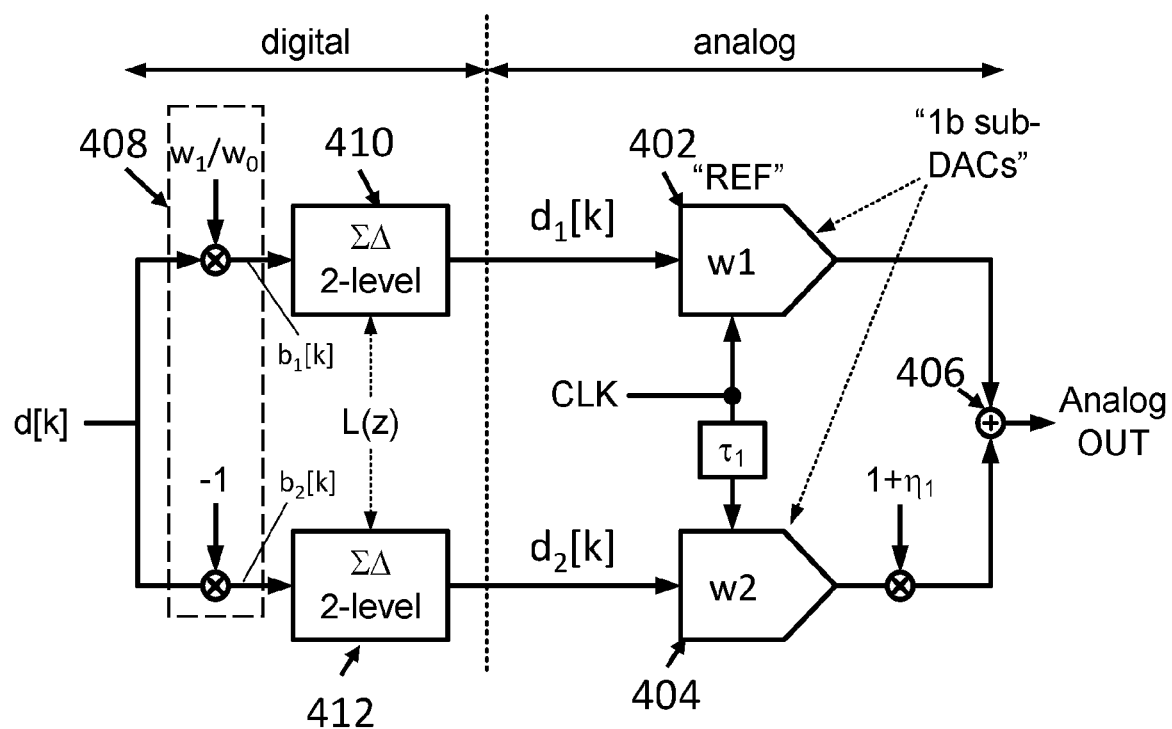
FIG. 4 illustrates an exemplary system for measuring non-idealities of a DAC, according to some embodiments of the disclosure.

FIG. 4 illustrates an exemplary system for measuring non-idealities of a DAC, according to some embodiments of the disclosure. One aspect of the system is the use of two digital noise shapers (having response $L(z)$) to generate test input signals $d_1[k]$ and $d_2[k]$ from $d[k]$ to drive two DAC cells (labeled as one-bit "1b" sub-DACs"). Digital noise shapers can advantageously generate signals where noise is pushed out of band. For instance, the digital noise shapers can be delta sigma two-level "$\Sigma\Delta$ 2-level" noise shapers. The digital noise shapers receive signals which are generated from a test signal $d[k]$. Any suitable signal can be used as $d[k]$. Typically, $d[k]$ is selected to ensure the residual signal can be sensed easily and to ensure the residual signal would be present if the DAC has non-idealities.

The digital-to-analog converter (DAC) has a plurality of DAC cells, in this example, DAC cells including a first DAC cell 402 and a second DAC cell 404 (labeled also as "1-b sub-DACs"), whose outputs are summed by combiner 406 to generate an analog output of the DAC ("Analog OUT"). For illustration, the first DAC cell 402 is the reference DAC cell having weight $w_1$, and the second DAC cell 404 is the DAC cell under test having weight $w_2$. The weights $w_1$ and $w_2$ do not necessarily have to be the same. The system includes a test signal generator 408 to scale a test signal $d[k]$ with a first multiplicative factor and to scale the test signal $d[k]$ with a second multiplicative factor to generate a first test signal $b_1[k]$ and a second test signal $b_2[k]$ respectively. To scale the test signal $d[k]$, the test signal generator 408 can include one or more multipliers (or equivalent digital logic) for multiplying the test signal $d[k]$ with the first multiplicative factor, and one or more multipliers (or equivalent digital logic) for multiplying the test signal $d[k]$ with the second multiplicative factor.

To provide the coding of test signals into a bit stream suitable for the first DAC cell 402 and the second DAC cell 404, the system further includes a first noise shaper 410 to process the first test signal $b_1[k]$ and generate a first test input signal $d_1[k]$, and a second noise shaper 412 to process the second test signal $b_2[k]$ and generate a second test input signal $d_2[k]$. The first test input signal $d_1[k]$ and the second test input signal $d_2[k]$ are provided as input to the first DAC cell 402 and the second DAC cell 404 respectively. In some embodiments, the first noise shaper 410 and the second noise shaper 412 are delta sigma encoders. The digital noise shapers can be configured to elicit more error/residual signal at the analog output of the DAC. For instance, certain error behavior can be enhanced by setting certain internal parameters of digital noise shaper to specific values for this application.

Figure 11:
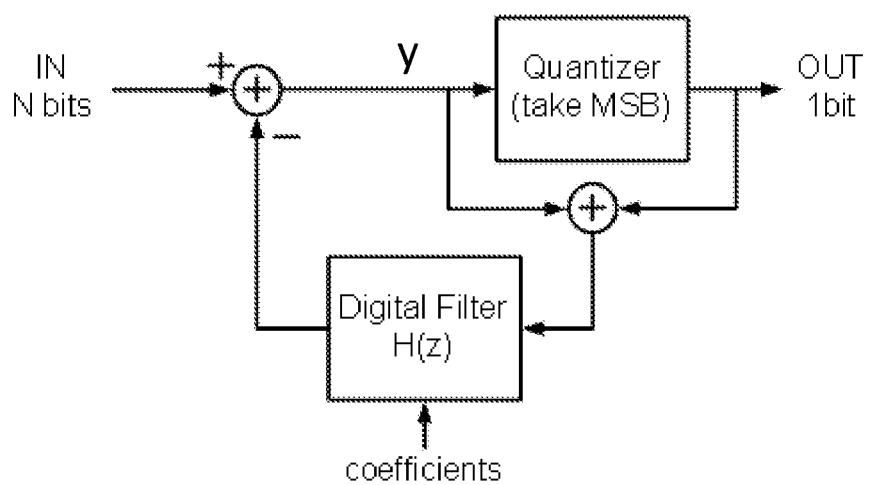
FIG. 11 illustrates an exemplary noise shaper, according to some embodiments of the disclosure.

Consider FIG. 11, an exemplary noise shaper as shown implements an error feedback model. A noise shaper can receive an input IN (an N bit input stream) and generate an output OUT (a 1 bit stream). The noise shaper may implement a quantizer which quantizes signal y. The signal y and OUT can be summed and processed by a digital filter $H(z)$ to generate a feedback signal. IN is subtracted by the feedback signal to generate y. The digital filter $H(z)$, i.e. its structure and coefficients, is designed such that the modulator (i.e., the noise shaper) is stable and has the desired properties. In usual applications, the desired properties include bandwidth (or oversampling ratio), dynamic range, stability range (with respect to the input amplitude) etc.

Settings used for this particular application of the noise shaper may not be not used in a normal application (since such settings can generate unwanted behavior such as out-of-band noise peaking). But for this context, where it is desirable to elicit more error to make the error more detectable, it can be beneficial to set those internal parameters of the digital noise shaper to generate more error or noise. In particular, it may be advantageous to change the digital filter internal parameters in a way to not focus too much about dynamic range and the like (although low noise floor may be of interest). Rather, the internal parameters can be selected to that it is possible to generate more error signal. For example, the 2nd harmonic distortion depends, for a given duty cycle error, on the signal correlated activity of the noise shaper (in a complex way). In usual applications, the noise shaper is chosen such that this error is minimized (which is of course only possible within certain limits due to the main, signal related desired specifications). If duty cycle error is to be detected, it may be advantageous to choose $H(z)$ such that this error is instead enhanced, maybe at the cost of some other performance metric that isn't important in this context. Furthermore, it is relative easy to implement such internal parameters to tailor the digital noise shapers to this application since the digital noise shapers are implemented in the digital domain.

The system can further include a sensing circuit (same or similar to sensing circuit 210 of FIG. 2) to observe the analog output of the DAC ("Analog OUT") and measure an error of the second DAC cell 404 with respect to the first DAC cell 402.

Since the noise shapers (first noise shaper 410 and second noise shaper 412) are in the digital domain, the noise shapers can be implemented to match each other perfectly (so as to not introduce further errors when the DAC cells are being calibrated). With sufficient digital resolution in the digital signals and the noise shaper, various test signals in the system can be made as perfect as possible or practicable prior to providing them to the DAC cells. Even the multiplicative factors can be made as perfect as practicable in the digital domain or as needed or required by a particular application (i.e., desired accuracy of the calibration). On the digital to analog interface, signals (e.g., $d_1[k]$ and $d_2[k]$) are perfect. Furthermore, another advantage of the digital noise shapers or other suitable calibration pattern generators is that they can receive any suitable signal that had been scale it to any value (e.g., according to any differences in bit weights between the reference DAC cell and the DAC cell under test). As illustrated by FIG. 4 (and FIG. 3 as well), $d[k]$ can comprise a sine wave or sinusoid (though other signals can also be used), which can elicit a residual signal in the analog output of the DAC that is easy to detect or sense. The overall system allows great flexibility to choose $d[k]$ in such a way to elicit a certain class of errors between the two DAC cells which can be readily detected at the output.

In some embodiments, the first multiplicative factor comprises a ratio of a bit weight of the second DAC cell $w_2$ and a bit weight of the first DAC cell $w_1$. An exemplary ratio is $w_2/w_1$. The first multiplicative factor scales the test signal $d[k]$ appropriately to account for a difference in bit weight between the first DAC cell 402 and the second DAC cell 404 (i.e., $w_1 \neq w_2$). The second multiplicative factor can be −1, so that the test signal d[k] can be inverted. Using −1 as the second multiplicative factor is not mandatory, but it can maximize the output of the potentially smaller cell (e.g., second DAC Cell 404), such that the error signal is maximized. Either the first multiplicative factor or the second multiplicative factor comprises a negative coefficient for inverting the test signal d[k] or a scaled version of the test signal (e.g., $b_1[k]$ or $b_2[k]$), assuming the input signal is d[k] for both generators. No inversion is needed, if two perfectly inverted d[k] and −d[k] are generated. Using these multiplicative factors, the magnitude of the output signals of the first DAC cell 402 and the second DAC cell 404 can substantially cancel out each other while a residual signal representing the non-idealities of the DAC remains at the analog output of the DAC ("Analog OUT").

Different Scaling Schemes

Figure 5:
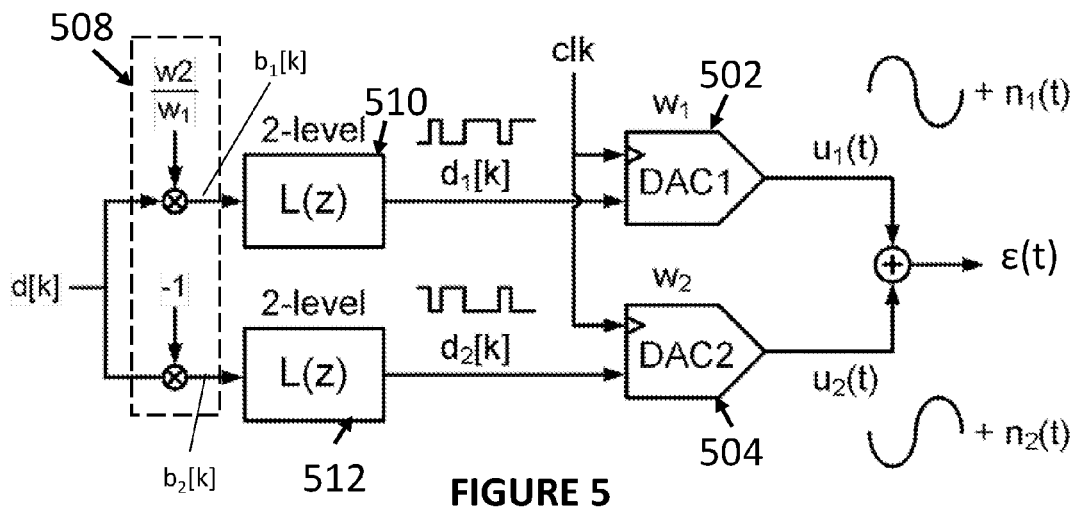
FIG. 5 illustrates an exemplary implementation for measuring non-idealities of a DAC, according to some embodiments of the disclosure.
Figure 6:
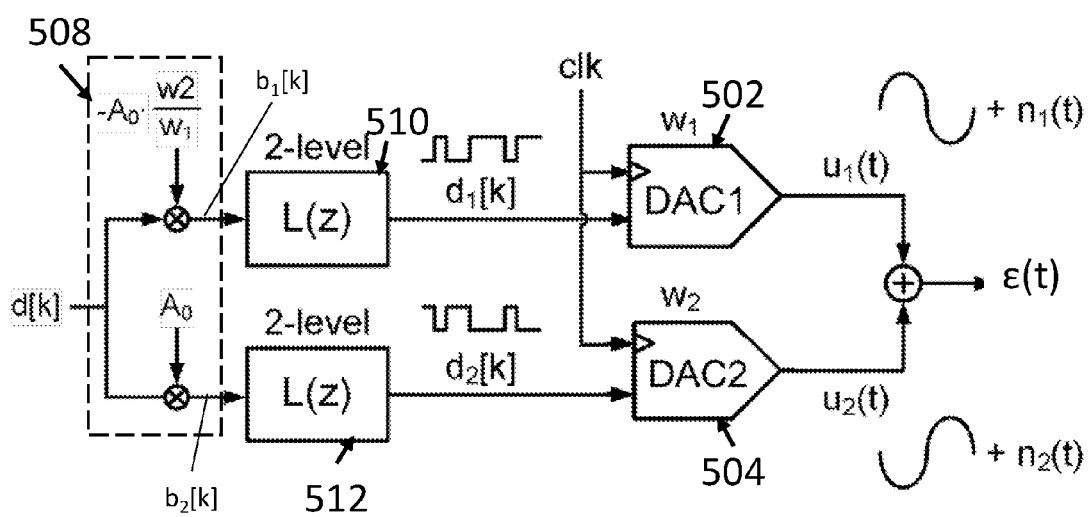
FIG. 6 illustrates another exemplary implementation for measuring non-idealities of a DAC, according to some embodiments of the disclosure.

FIG. 5 illustrates an exemplary implementation for measuring non-idealities of a DAC, according to some embodiments of the disclosure. FIG. 6 illustrates another exemplary implementation for measuring non-idealities of a DAC, according to some embodiments of the disclosure. Both embodiments shown in FIGS. 5 and 6 has the same or similar parts as FIG. 4, and the scaling scheme for the test signal d[k] varies between FIGS. 5 and 6. The digital-to-analog converter (DAC) has a plurality of DAC cells, in this example, DAC cells including a first DAC cell 502 ("DAC1") and a second DAC cell 504 ("DAC2"), whose outputs are summed by combiner 506 to generate an analog output of the DAC. For illustration, the first DAC cell 502 is the reference DAC cell having weight $w_1$, and the second DAC cell 504 is the DAC cell under test having weight $w_2$. The weights $w_1$ and $w_2$ do not necessarily have to be the same. Phrased differently, the overall system includes first means for generating a first analog output $u_1(t)$ based on a first two-level input $d_1[k]$ (e.g., first DAC cell 502) and second means for generating a second analog output $u_2(t)$ based on a second two-level input $d_2[k]$ (e.g., second DAC cell 504). Furthermore, the overall system includes third means for combining at least the first analog output $u_1(t)$ and the second analog output $u_2(t)$ to generate an analog output of the DAC (e.g., combiner 506). With proper two-level inputs $d_1[k]$ and $d_2[k]$, a residual signal $\epsilon(t)$ representing non-idealities of the DAC remains at the analog output of the DAC.

Similar to FIG. 4, the system includes fourth means for digitally generating the first two-level input and the second two-level input based on a test signal. The fourth means can include a test signal generator 508 to scale a test signal d[k] with a first multiplicative factor and to scale the test signal d[k] with a second multiplicative factor to generate a first test signal $b_1[k]$ and a second test signal $b_2[k]$ respectively. To scale the test signal d[k], the test signal generator 508 can include one or more multipliers (or equivalent digital logic) for multiplying the test signal d[k] with the first multiplicative factor, and one or more multipliers (or equivalent digital logic) for multiplying the test signal d[k] with the second multiplicative factor. The fourth means can further include means for encoding the first test signal $b_1[k]$ and the second test signal $b_2[k]$ as the first two-level input $d_1[k]$ and the second two-level input $d_2[k]$ respectively. For instance, the fourth means can further include a first noise shaper 510 and a second noise shaper 512 to provide the coding of a the first test signal $b_1[k]$ and the second test signal $b_2[k]$ into a bit stream suitable for the first DAC cell 502 and the second DAC cell 504 (e.g., $d_1[k]$ and $d_2[k]$). The bit streams generated by the first noise shaper 510 and the second noise shaper 512, e.g., first test input signal $d_1[k]$ and the second test input signal $d_2[k]$, are provided as input to the first DAC cell 502 and the second DAC cell 504 respectively. In some embodiments, the first noise shaper 510 and the second noise shaper 512 are delta sigma encoders.

To detect the residual signal $\epsilon(t)$, the system can include fifth means (coupled to the analog output of the DAC) for sensing an error of the second means with respect to the first means in the analog output of the DAC. Fifth means can include circuitry such as the sensing circuit 210 of FIG. 2. To calibrate the DAC, the system can include sixth means for correcting the error in the second means (e.g., adjusting the second DAC cell 504). Sixth means can include circuitry such as the control circuit 206 of FIG. 2.

In FIG. 5, the first multiplicative factor comprises a ratio of a bit weight of the second DAC cell $w_2$ and a bit weight of the first DAC cell $w_1$. Phrased differently, fourth means can include means for scaling the test signal by a ratio of the weight of the second DAC cell and the weight of the first DAC cell (e.g., $w_2/w_1$) to generate a first test signal $b_1[k]$, and means for inverting the test signal (e.g., using multiplicative factor of −1) to generate a second test signal $b_2[k]$. An exemplary ratio for the first multiplicative factor is $w_2/w_1$. The first multiplicative factor scales the test signal d[k] appropriately to account for a difference in bit weight between the first DAC cell 502 and the second DAC cell 504 (i.e., $w_1 \neq w_2$). The second multiplicative factor can be −1, so that the test signal d[k] can be inverted. Generally speaking, either the first multiplicative factor or the second multiplicative factor has a negative sign. In FIG. 6, first multiplicative factor and the second multiplicative factor each comprises a coefficient $A_0$ selected based on a dynamic range of the first and second noise shapers. The first multiplicative factor can be $-A_0(w_2/w_1)$, and the second multiplicative factor can be $A_0$. The coefficient $A_0$ can be chosen to operate the DAC cell under test with maximum digital gain. The first multiplicative factor scales the reference cell accordingly to accommodate for difference in bit weight between the two DAC cells. Furthermore, coefficient $A_0$ can be chosen to be close to noise shapers' overload.

In some cases, noise shaper may impose limits on the value of $A_0$ for stability reasons, e.g. $A_0$ being equal to an arbitrary digital full-scale value) may overload the noise shaper. $A_0$ needs to be chosen close but not above the stability limit of the digital noise shaper (which is a feedback system). The stability limit may depend on the actual input signal. Since it is a digital system and the input signal is known, $A_0$ is can be determined. On the other hand, the noise shaper can also be (stability) optimized (within limits) to accept a large as possible input signal.

In some embodiments, the first and second means have different bit weights (e.g., $w_1 \neq w_2$), and the first two-level input $d_1[k]$ and the second two-level input $d_2[k]$ comprises a 1-bit delta-sigma sine wave test signal (as previously described with respect to FIG. 3). This example is meant to be illustrative and not limiting to the disclosure.

Extracting Amplitude Error

The following explains an example of using delta sigma modulated sine waves as test input signals to two DAC cells (one is a reference DAC cell and the other is a DAC cell under test), which may have the same bit weight or different bit weights. The figures examines the analog outputs of the DAC cells, and the residual signal that remains when the two analog outputs are combined.

Figure 7:
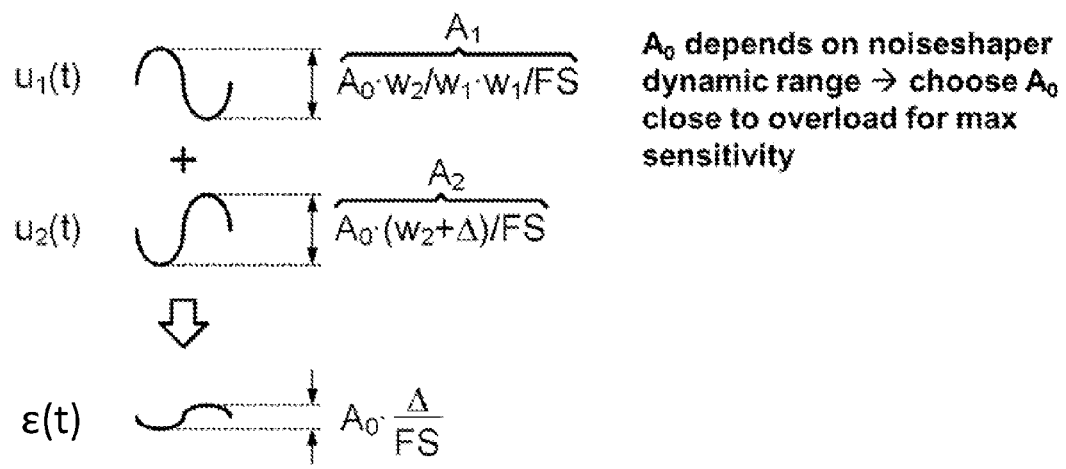
FIG. 7 illustrates a scheme for extracting amplitude error from an output of the DAC, according to some embodiments of the disclosure.

FIG. 7 illustrates a scheme for extracting amplitude error from an output of the DAC, according to some embodiments of the disclosure. Delta A represents the amplitude error. In the scheme shown, it can be seen that the error associated with amplitude error can be observed at the following frequency:

$$\text{Fund}[dBFS] = 20\log_{10}\left(\frac{A_0}{2} \cdot \frac{\Delta}{2^B - 1}\right)$$

The error is independent of cell weight, frequency, and the error can relate to the signal level $A_0$ of the two-level noise shaper. As previously mentioned $A_0$ can be set based on the noise shaper (and its limitations). $A_1$ and $A_2$ are the (inverted) output levels of the two DAC cells.

FIG. 8 illustrates a scheme for extracting timing skew from an output of the DAC, according to some embodiments of the disclosure. $\tau_{SKEW}$ represents the timing skew. In the scheme shown, it can be seen the error associated with timing skew can be observed at the following frequency:

$$\text{Fund} = A_0 \frac{w}{2^B - 1} \cdot \sin(\pi f_0 \tau_{SKEW}) \cdot \frac{\sin(\pi f_0 T)}{\pi f_0 T} \approx \frac{A_0 f_0 \tau_{SKEW} \pi w}{2^B - 1} \cdot \frac{\sin(\pi f_0 T)}{\pi f_0 T}$$

The error is dependent on the frequency of the sinusoids $f_0$.

Figure 9:
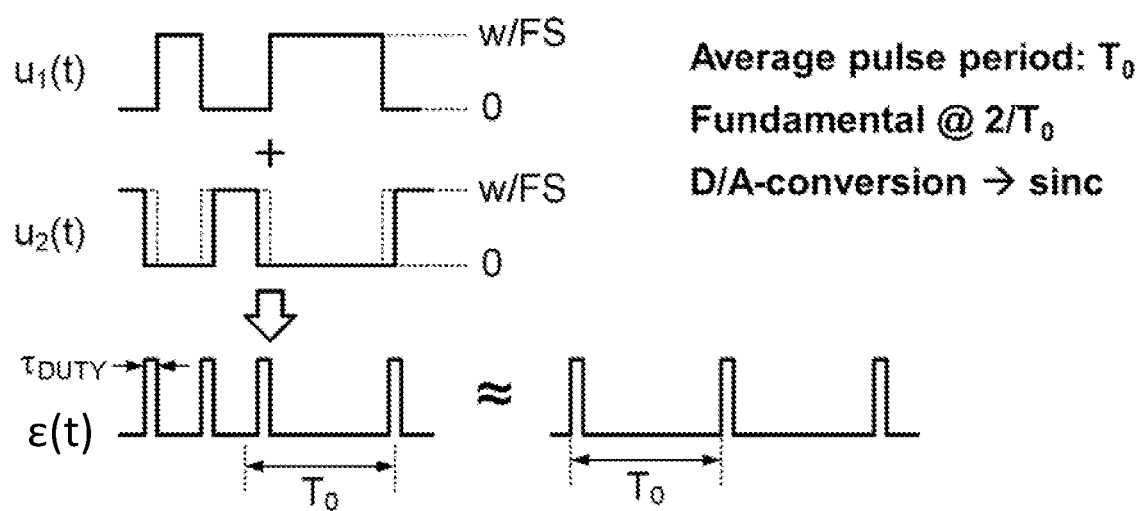
FIG. 9 illustrates a scheme for extracting duty cycle error from an output of the DAC, according to some embodiments of the disclosure.

FIG. 9 illustrates a scheme for extracting duty cycle error from an output of the DAC, according to some embodiments of the disclosure. $\tau_{duty}$ represents the duty cycle error. In the scheme shown, it can be seen the error associated with duty cycle error can be observed at the following frequency:

$$\text{Fund} = \frac{A_0}{\pi} \cdot \frac{w}{2^B - 1} \cdot \sin(2\pi f_0 \tau_{DUTY}) \cdot \frac{\sin(\pi f_0 T)}{\pi f_0 T} \approx \frac{2w A_0 f_0 \tau_{DUTY}}{2^B - 1} \cdot \frac{\sin(\pi f_0 T)}{\pi f_0 T}$$

The error is dependent on twice of the frequency of the sinusoids $2f_0$.

Depending on the implementation, the analog output of the DAC (or respective outputs of the DAC cells, if applicable), are observed over many samples. In some embodiments, the minimum acquisition time can be computed based on factors such as, minimum signal to noise ratios, coefficients associated with the noise shapers, frequency being observed by the receiver, sampling clock jitter in the sensing ADC, etc. Sensing circuit non-idealities can limit the detection of the error. Sensor noise can be averaged (just have to wait longer while sensing if needed). Other non-idealities like non-linear distortion may irreversibly cover up the error signal during calibration (i.e., mixing of out-of-band noise/signal content to the location of the error signal) and make detection impossible. This also heavily depends on the properties of the test signal, but such properties are known and can be taken into account.

Method for Measuring Non-Idealities of a DAC

Figure 10:
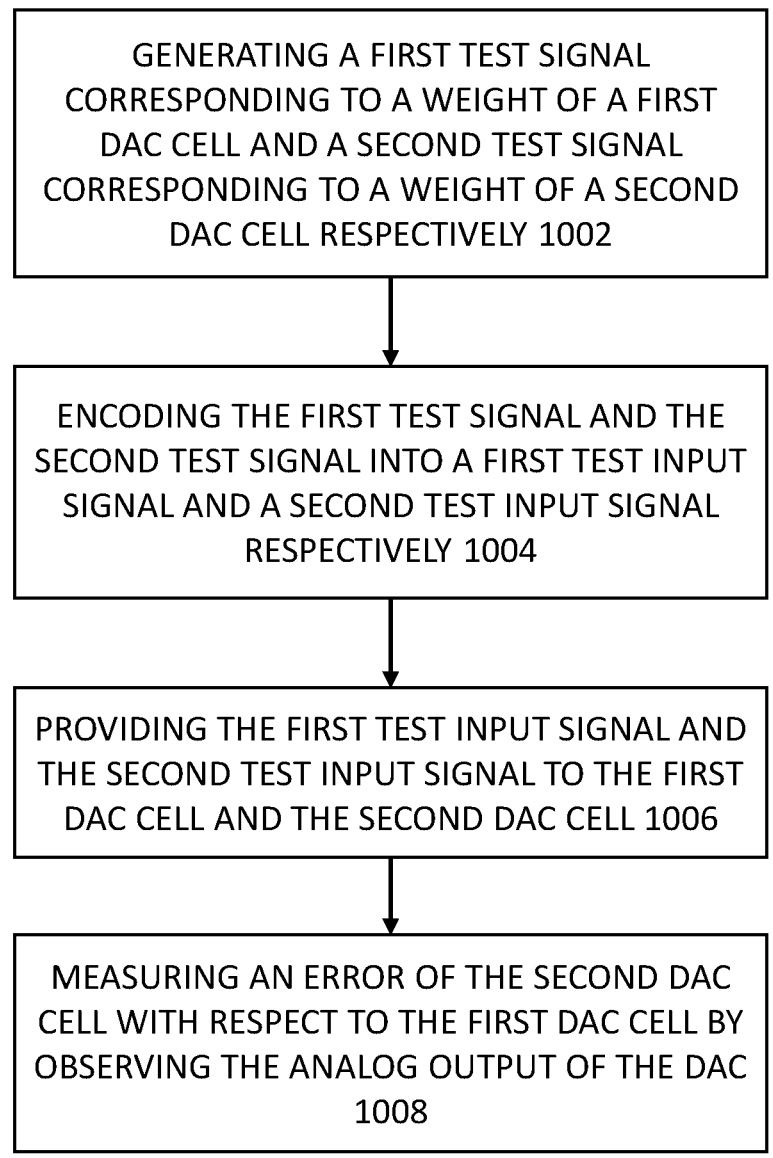
FIG. 10 illustrates a method for measuring non-idealities of a DAC, according to some embodiments of the disclosure.

FIG. 10 illustrates a method for measuring non-idealities of a DAC, according to some embodiments of the disclosure. The DAC has a plurality of DAC cells whose outputs are summed to generate an analog output of the DAC (as illustrated by, e.g., FIGS. 1-6). In task 1002, a test signal generator generates a first test signal corresponding to a weight of a first DAC cell and a second test signal corresponding to a weight of a second DAC cell (e.g., $b_1[k]$, $b_2[k]$ of the FIGS. 4-6). In task 1004, noise shapers or digital encoders encoding the first test signal and the second test signal into a first test input signal and a second test input signal respectively (e.g., $d_1[k]$, $d_2[k]$ of the FIGS. 4-6). In task 1006, the first test input signal and the second test input signal (e.g., $d_1[k]$, $d_2[k]$ of the FIGS. 4-6) are provided as input to the first DAC cell and the second DAC cell. The first DAC cell and the second DAC cell convert the first test input signal and the second input test signal respectively into respective analog outputs. The analog outputs are summed or combined, which results in an error signal. In task 1008, the error of the second DAC cell with respect to the first DAC cell is measured by observing the analog output of the DAC (i.e., the error signal present at the analog output of the DAC).

In some embodiments, generating the first test signal and the second test signal comprises: multiplying a test signal (e.g., $d[k]$) by a ratio of the weight of the second DAC cell and the weight of the first DAC cell (e.g., $w_2/w_1$) to generate the first test signal (e.g., $b_1[k]$) and inverting the test signal (e.g., multiplying the test signal by $-1$) to generate the second test signal (e.g., $b_2[k]$). Generally speaking, the first test signal and the second test signal (e.g., $b_1[k]$, $b_2[k]$) are generated by digitally scaling a test signal (e.g., $d[k]$) according to the weight of the first DAC cell and the weight of the second DAC cell (e.g., $w_1$ and $w_2$).

In some embodiments, encoding the first test signal and the second test signal comprises encoding the first test signal and the second test signal as two-level bit streams, which is the (only) acceptable format for an input signal to a DAC cell. In some embodiments, encoding the first test signal and the second test signal comprises converting the first test signal and the second test signal into the first test input signal and the second test input signal respectively using delta-sigma modulation. Delta-sigma modulation (or more generally an error-feedback structure) is one example embodiment, other modulation schemes can be used.

In some embodiments, encoding the first test signal and the second test signal can include lowering bit-depth of the first test signal and the second test signal to generate the first test input signal and the second test input signal using a digital quantizer in an error-feedback structure. Such an encoding scheme implements noise shaping of the first test signal and the second test signal. Preferably, the encoding is performed by a suitable digital pre-coder having a desirable frequency response (e.g., L(z) or a suitable transfer function of an error feedback structure) to generate test input signals to the DAC cells that can elicit a measurable residual signal. The test input signals perfectly cancel each other out in the digital side. But once the test input signals are processed by the DAC cells, the analog non-idealities of the DAC causes the analog output of the DAC to have a residual signal (no longer perfectly cancelling).

In some implementations, the calibration scheme includes observing respective outputs of the first DAC cell and the second DAC cell. In some cases, the combiner summing all the outputs of the DAC cells may introduce an additional error. The calibration scheme can first calibrate for the amplitude error, which does not require observing the output of the overall DAC, and can easily detect amplitude error by observing respective outputs of the reference DAC cell and the DAC cell under test. After the amplitude error is calibrated out, the calibration scheme can calibrate for other errors, e.g., timing skew, duty cycle error, etc., by observing the analog output of the overall DAC. In some cases, this is necessary, since the amplitude error is frequency independent and otherwise may mask the dynamic errors. This might be the case especially if only the magnitude of the output is observed as in the simple preferred embodiment. If the sensing receiver can discriminate between amplitude and phase. For instance, the sensing receiver can be a complex (I+jQ) sensing receiver (which might already be available in the system. In some cases, it is preferable to extract amplitude error before extracting other errors.

Selecting Test Signals and Test Input Signals

The calibration scheme can occur in the foreground (i.e., during a calibration mode when the DAC is not processing actual data).

In some embodiments, the first test signal and the second test signal each comprises a sine wave. Other waveforms can also be used, e.g. a combination of sine-waves (like two-tone). For instance, a sine wave which varies in frequency over time can be used. The first test signal and the second test signal can include a combination of sinusoids or signals. Preferably, the first test signal and the second test signal can vary in both frequency and amplitude to allow for flexibility in the calibration scheme to work for various DAC cells (e.g., different bit weights) and systems (e.g., different operating/clock frequencies). In some embodiments, the test input signals to the DAC cells can include spread spectrum noise sequence(s) (e.g., one which is an inverse of the other). Spread spectrum noise sequences can also be scaled in the digital domain through multiplication by a multiplicative factor prior to noise shaping.

In some cases, the test input signals to the DAC cells are generated to not substantially interfere with signal content within the frequency band of interest at the analog output. In some cases, with the proper first test signal and the second test signal, it is possible to operate the calibration scheme in the background (i.e., providing the test input signals and observing the output of the DAC during normal operation of the DAC=while the DAC is operating to convert actual data to an analog signal). Background calibration is possible if the signals are selected to not interfere with signal content in the band of interest or affect the normal output of the DAC. A filter can be implemented to filter out undesirable signal components caused by the calibration scheme (e.g., the test signals or test input signals). Spread spectrum noise sequences would ideally only result in "white noise" at the output of the DAC; delta-sigma modulated sine waves advantageously have a fairly narrow in-band frequency range (but possibly with a lot of out of band noise).

Different from Using Square Waves

Previous efforts used simple square wave patterns that do not offer the frequency and amplitude agility of a sigma-delta pattern. A square wave can only vary in frequency (and can only assume integer ratios of the main sampling clock frequency), but a delta-sigma encoded pattern can vary in frequency and in amplitude. Using a 2-level noise shaper means it is possible to use any suitable signal.

One skilled in the art would appreciate that using square wave patterns as test input signals to the DAC cells cannot scale to compare two DAC cells having different bit weights (e.g., comparing a single most-significant bit DAC cell (MSB) to intermediate-significant bit DAC cell (ISB) or a least-significant bits DAC cell (LSB)). Square waves can only compare two DAC cells of the same weight, or additional dummy DAC cells are needed to cancel out the test signals. With delta sigma coded patterns, calibration can occur across cells with different bit weights, cells from different segments, cells with different coding. Digital noise shapers also means the scaling and the precision of the test input signals can be done perfectly in digital.

One skilled in the art would also understand that sensitivity of square waves as test input signals can be limited by clock spurs, and even if the detection frequency is spur-free, the error signal is usually translated down to DC, such that they require a high-accuracy, low-noise, low-offset at DC in the receiver observing the analog output. Sensitivity of delta-sigma coded patterns as test input signals is not limited by clock spurs (since the sine wave can be placed anywhere between 0 to half of the clock frequency), and does not require a high-accuracy, low-noise, low-offset at DC in the receiver observing the analog output.

Averaged Calibration

In some embodiments, the patterns as input to the DAC cells can be digitally created to calibrate any suitable combination of bit cells simultaneously (e.g., comparing between reference DAC cell and two or more DAC cells under test, comparing between two or more reference DAC cell and one DAC cell under test, or comparing between two or more reference DAC cells and two or more DAC cells under test) for an averaged calibration. For the sake of clarity, the present disclosure describes comparing between one reference DAC bit cell and one DAC bit cell under test. It is envisioned by the disclosure that the embodiments can be extended to perform the averaged calibration mentioned above (e.g., scaling of the original test signal would be performed differently to accommodate more reference DAC cells and/or more DAC bit cells under test) while achieving cancellation to obtain the residual error at the analog output.

Variations and Implementations

Note that the activities discussed above with reference to the FIGURES are applicable to any integrated circuits that involve calibrating DAC cells of a DAC. The embodiments described herein can be used to calibrate DACs having different architectures. Preferably, the embodiments can apply to a DAC whose independent elements or cells corresponding to controlling input bit lines directly sum at the output, like current-steering or potentially parallel capacitor DACs (which is really the majority of signal processing DACs). Other architectures like resistor string (precision applications) or pipeline capacitor DAC perform partial summation before the output is reached and are therefore not amenable to this method. Performance of a DAC, i.e., measure of distortions at the output, is critical for some applications. The calibration scheme of the present disclosure provides a flexible and effective way for measuring error(s) between a reference DAC cell and a DAC cell under test. In certain contexts, the features discussed herein can be applicable to medical systems, scientific instrumentation, wireless and wired communications, radar, industrial process control, audio and video equipment, current sensing, instrumentation (which can be highly precise), cable infrastructure, military (e.g., Radar), and other systems where reducing distortion at the output of a DAC is important to the application.

While the present application describes two-level bit streams, it is appreciated by one skilled in the art that a three-level bit streams can be used as input to DAC cells having a different current cell architecture. Some current cell architectures can have three possible output levels −1,0,+1, and thus requires a three-level input stream. In a similar fashion as using a two-level bit stream, a noise shaped three-level bit stream can be used as input to this current cell architecture. Although the error output could be different (especially with dynamic errors), DC-error output can show very similar behavior. The three-level bit stream can have a bit=0/1, and reset=0/1, with reset=1 overwriting bit and representing the $3^{rd}$ state. The bit stream can be generated by a three-level noise shaper, based on the same kind of signals $d_1[k]$ and $d_2[k]$.

The sensing circuit at the output of the DAC can be implemented in different ways. One example is a complex (I+jQ) sensing receiver. Using a complex sensing receiver enables observation of magnitude and phase of the error signal. This would mean that amplitude calibration doesn't have to be done before other calibrations. Note that using a real receiver can mean that amplitude calibration has to occur before other calibrations. A complex receiver may also allow other properties (with different phase) of the error signal to be observed more easily.

Parts of various apparatuses for calibration DAC cells can include digital or electronic circuitry to perform the functions described herein. In some cases, one or more parts of the apparatus can be provided by a processor (e.g., an on-chip processor, an on-chip microprocessor, an on-chip digital signal processor, an off-chip processor, an off-chip microprocessor, and off-chip digital signal processor) specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure and/or claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the disclosure and/or claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to calibration, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the present disclosure. Note that all optional features of the apparatus described above may also be implemented with respect to the method or process described herein and specifics in the examples may be used anywhere in one or more embodiments.

Examples

Example 1 is a method for measuring non-idealities of a digital-to-analog converter (DAC) having a plurality of DAC cells whose outputs are summed to generate an analog output of the DAC, the method comprising: generating a first test signal corresponding to a weight of a first DAC cell and a second test signal corresponding to a weight of a second DAC cell, encoding the first test signal and the second test signal into a first test input signal and a second test input signal respectively, providing the first test input signal and the second test input signal to the first DAC cell and the second DAC cell, and measuring an error of the second DAC cell with respect to the first DAC cell by observing the analog output of the DAC or respective outputs of the first DAC cell and the second DAC cell.

In Example 2, Example 1 can further include generating the first test signal and the second test signal comprising: multiplying a test signal by a ratio of the weight of the second DAC cell and the weight of the first DAC cell to generate the first test signal; and inverting the test signal to generate the second test signal.

In Example 3, any one of Examples 1-2 can further include the first test signal and the second test signal being generated by digitally scaling a test signal according to the weight of the first DAC cell and the weight of the second DAC cell.

In Example 4, any one of the Examples 1-3 can further include encoding the first test signal and the second test signal comprising encoding the first test signal and the second test signal as two-level bit streams.

In Example 5, any one of the Examples 1-4 can further include encoding the first test signal and the second test signal comprising converting the first test signal and the second test signal into the first test input signal and the second test input signal respectively using delta-sigma modulation.

In Example 6, any one of the Examples 1-5 can further include encoding the first test signal and the second test signal comprising lowering bit-depth of the first test signal and the second test signal to generate the first test input signal and the second test input signal.

In Example 7, any one of the Examples 1-6 can further include the first test signal and the second test signal each comprising a sine wave.

In Example 8, any one of the Examples 1-7 can further include the error comprising amplitude error.

In Example 9, any one of the Examples 1-8 can further include the error comprising timing skew.

In Example 10, any one of the Examples 1-8 can further include the error comprising duty cycle error.

Example 11 is a system for measuring non-idealities of a digital-to-analog converter (DAC) having a plurality of DAC cells whose outputs are summed to generate an analog output of the DAC, the system comprising: a test signal generator to scale a test signal with a first multiplicative factor and to scale the test signal with a second multiplicative factor to generate a first test signal and a second test signal respectively, a first noise shaper to process the first test signal and generate a first test input signal, a second noise shaper to process the second test signal and generate a second test input signal, wherein the first test input signal and the second test input signal are provided as input to a first DAC cell and a second DAC cell, and a sensing circuit to observe the analog output of the DAC and measure an error of the second DAC cell with respect to the first DAC cell.

In Example 12, Example 11 can further include the first multiplicative factor comprising a ratio of a bit weight of the second DAC cell and a bit weight of the first DAC cell.

In Example 13, any one of Examples 11 or 12 can further include the first multiplicative factor and the second multiplicative factor each comprising a coefficient selected based on a dynamic range of the first and second noise shapers.

In Example 14, any one of Examples 11-13 can further include either the first multiplicative factor or the second multiplicative factor comprising a negative coefficient for inverting the test signal or a scaled version of the test signal.

In Example 15, any one of Examples 11-14 can further include the first noise shaper and the second noise shaper being delta sigma encoders.

In Example 16, any one of Examples 11-15 can further include the test signal comprising a sine wave.

Example 17 is a digital-to-analog converter (DAC) comprising: first means for generating a first analog output based on a first two-level input, second means for generating a second analog output based on a second two-level input, third means for combining at least the first analog output and the second analog output to generate an analog output of the DAC, fourth means for digitally generating the first two-level input and the second two-level input based on a test signal, and fifth means for sensing an error of the second means with respect to the first means in the analog output of the DAC.

In Example 18, Example 17 can further include sixth means for correcting the error in the second means.

In Example 19, any one of Examples 17-18 can further include means for scaling the test signal by a ratio of the weight of the second DAC cell and the weight of the first DAC cell to generate a first test signal, means for inverting the test signal to generate a second test signal, and means for encoding the first test signal and the second test signal as the first two-level input and the second two-level input respectively.

In Example 20, any one of Examples 17-19 can further include the first and second means have different bit weights, and the first two-level input and the second two-level input comprises a 1-bit delta-sigma sine wave test signal.

What is claimed is:

1. A method for measuring non-idealities of a digital-to-analog converter (DAC) having a plurality of DAC cells whose outputs are summed to generate an analog output of the DAC, the method comprising:
   generating a first test signal corresponding to a weight of a first DAC cell and a second test signal corresponding to a weight of a second DAC cell;
   encoding the first test signal and the second test signal into a first test input signal and a second test input signal respectively; and
   providing the first test input signal and the second test input signal to the first DAC cell and the second DAC cell.

2. The method of claim 1, wherein generating the first test signal and the second test signal comprises:

multiplying a test signal by a ratio of the weight of the second DAC cell and the weight of the first DAC cell to generate the first test signal; and inverting the test signal to generate the second test signal.

3. The method of claim 1, wherein the first test signal and the second test signal are generated by digitally scaling a test signal according to the weight of the first DAC cell and the weight of the second DAC cell.

4. The method of claim 1, wherein encoding the first test signal and the second test signal comprises:

encoding the first test signal and the second test signal as two-level bit streams.

5. The method of claim 1, wherein encoding the first test signal and the second test signal comprises:

converting the first test signal and the second test signal into the first test input signal and the second test input signal respectively using delta-sigma modulation.

6. The method of claim 1, wherein encoding the first test signal and the second test signal comprises:

lowering bit-depth of the first test signal and the second test signal to generate the first test input signal and the second test input signal.

7. The method of claim 1, wherein the first test signal and the second test signal each comprises a sine wave.

8. The method of claim 1, further comprising:

measuring an amplitude error of the second DAC cell with respect to the first DAC cell by observing the analog output of the DAC or respective outputs of the first DAC cell and the second DAC cell.

9. The method of claim 1, further comprising:

measuring timing skew of the second DAC cell with respect to the first DAC cell by observing the analog output of the DAC or respective outputs of the first DAC cell and the second DAC cell.

10. The method of claim 1, further comprising:

measuring duty cycle error of the second DAC cell with respect to the first DAC cell by observing the analog output of the DAC or respective outputs of the first DAC cell and the second DAC cell.

11. A system for measuring non-idealities of a digital-to-analog converter (DAC) having a plurality of DAC cells whose outputs are summed to generate an analog output of the DAC, the system comprising:

a test signal generator to scale a test signal with a first multiplicative factor and to scale the test signal with a second multiplicative factor to generate a first test signal and a second test signal respectively;

a first noise shaper to process the first test signal and generate a first test input signal; and a second noise shaper to process the second test signal and generate a second test input signal;

wherein the first test input signal and the second test input signal are provided as input to a first DAC cell and a second DAC cell.

12. The system of claim 11, wherein the first multiplicative factor comprises a ratio of a bit weight of the second DAC cell and a bit weight of the first DAC cell.

13. The system of claim 11, wherein the first multiplicative factor and the second multiplicative factor each comprises a coefficient selected based on a dynamic range of the first and second noise shapers.

14. The system of claim 11, wherein either the first multiplicative factor or the second multiplicative factor comprises a negative coefficient for inverting the test signal or a scaled version of the test signal.

15. The system of claim 11, wherein the first noise shaper and the second noise shaper are delta sigma encoders.

16. The system of claim 11, further comprising:

a circuit to observe the analog output of the DAC and measure an error of the second DAC cell with respect to the first DAC cell.

17. A digital-to-analog converter (DAC) comprising:

first DAC cell for generating a first analog output based on a first two-level input;

second DAC cell for generating a second analog output based on a second two-level input;

means for digitally generating the first two-level input and the second two-level input based on a test signal; and means for sensing an error of the second DAC cell with respect to the first DAC cell in the analog output of the DAC.

18. The DAC of claim 17, further comprising:

means for correcting the error in the second DAC cell.

19. The DAC of claim 17, wherein the means for digitally generating the first two-level input and the second two-level input comprises:

means for scaling the test signal by a ratio of the weight of the second DAC cell and the weight of the first DAC cell to generate a first test signal;

means for inverting the test signal to generate a second test signal; and means for encoding the first test signal and the second test signal as the first two-level input and the second two-level input respectively.

20. The DAC of claim 17, further comprising:

means for combining at least the first analog output and the second analog output to generate the analog output of the DAC;

wherein:

the first DAC cell and second DAC cell have different bit weights; and the first two-level input and the second two-level input comprises a 1-bit delta-sigma sine wave test signal.

21. A method for measuring non-idealities of a digital-to-analog converter (DAC) having a plurality of DAC cells whose outputs are summed to generate an analog output of the DAC, the method comprising:

receiving a first test input signal by a first DAC cell;

receiving a second test input signal by a second DAC cell, wherein the first test input signal and the second test input signal are encoded and generated based on a weight of the first DAC cell and a weight of the second DAC cell; and measuring an error of the second DAC cell with respect to the first DAC cell based on outputs of the first DAC cell and the second DAC cell.

* * * * *

UNITED STATES PATENT AND TRADEMARK OFFICE
CERTIFICATE OF CORRECTION

PATENT NO. : 9,577,657 B1
APPLICATION NO. : 15/144163
DATED : February 21, 2017
INVENTOR(S) : Clara et al.

It is certified that error appears in the above-identified patent and that said Letters Patent is hereby corrected as shown below:

On the Title Page

(72) Inventors should read:
Martin Clara, Newton, MA (US)
Gil Engel, Lexington, MA (US)

Signed and Sealed this
Seventh Day of August, 2018

Andrei Iancu
*Director of the United States Patent and Trademark Office*